United States Patent [19]

Palmer, II.

[11] Patent Number: 4,949,035
[45] Date of Patent: Aug. 14, 1990

[54] CONNECTOR ALIGNMENT VERIFICATION AND MONITORING SYSTEM

[75] Inventor: Ralph E. Palmer, II., Norwood, Mass.

[73] Assignee: Digital Equipment Corporation, Maynard, Mass.

[21] Appl. No.: 294,202

[22] Filed: Jan. 6, 1989

[51] Int. Cl.[5] .................. G01R 31/02; G08B 21/00
[52] U.S. Cl. .................. 324/158 R; 324/133; 340/635; 340/687
[58] Field of Search .............. 324/158 R, 73 PC; 340/635, 653, 656, 687; 439/488, 489, 490; 33/533

[56] References Cited

U.S. PATENT DOCUMENTS

| | | |
|---|---|---|
| 3,332,009 | 7/1967 | Seale . |
| 3,414,806 | 12/1968 | Carr . |
| 3,784,910 | 1/1974 | Sylvan . |
| 3,806,800 | 4/1974 | Bove et al. . |
| 3,891,279 | 6/1975 | Frait .................... 340/687 |
| 4,042,832 | 8/1977 | Cassarino, Jr. et al. ........... 340/653 |
| 4,183,091 | 1/1980 | Murai . |
| 4,319,078 | 3/1982 | Yokoo et al. . |
| 4,319,109 | 3/1982 | Bowles . |
| 4,377,315 | 3/1983 | Grau .................. 439/490 |
| 4,468,612 | 8/1984 | Starr .................. 439/489 |
| 4,507,697 | 3/1985 | Ozil et al. . |
| 4,587,481 | 5/1986 | Lischke et al. . |

*Primary Examiner*—Ernest F. Karlsen
*Attorney, Agent, or Firm*—Nutter, McClennen & Fish

[57] ABSTRACT

A connector alignment verification and monitoring system includes a circuit module having a surface with a plurality of spaced-apart, geometrically similar conductive terminal pads printed on it, each of the terminal pads having selected dimensions parallel to and perpendicular to an edge of the surface. Alignment sensing means are also printed on the module surface adjacent to that edge, the alignment sensing means including a series of closely spaced-apart, electrically isolated conductive features extending along the module surface generally in the direction of the edge. The system also includes a connector for coupling to the module, the connector including a plurality of contacts which are disposed opposite to, and establish electrical continuity with, the module terminal pads when the connector and module are in proper alignment. The connector also has an alignment contact which only contacts a selected one or more of the features of the series of features on the module. An alignment indicator in circuit with the alignment sensing means indicates which feature or features of the series of features is contacted by the alignment contact.

20 Claims, 1 Drawing Sheet

CONNECTOR ALIGNMENT VERIFICATION AND MONITORING SYSTEM

This invention relates to printed circuit modules and the connections thereto. It relates more particularly to a system which verifies that a circuit module and its connector are properly aligned to establish electrical continuity and thereafter monitors the status of that alignment.

BACKGROUND OF THE INVENTION

The circuit terminals of a printed circuit (PC) module or board usually take the form of an array of conductive pads positioned on the module, often at an edge thereof, so that the module circuit can be connected to external circuitry by coupling the module to or plugging it into an electrical connector. The connector is usually mounted to the end of a flexible cable or harness and it has an array of internal spring-like contacts which are connected to the various cable conductors. When the connector is properly coupled to the printed circuit module, its contacts resiliently engage the terminals or pads of the module. Usually each contact is formed with a raised boss or bump which is the actual point of contact with the corresponding pad of the module.

Under optimum conditions, when the connector and module are properly aligned, all of these contact points are more or less centered on their corresponding module pads so that reliable, low-resistance electrical connections are made between the connector contacts and those pads. However, if the module is coupled to or plugged into its connector improperly or incompletely, one or more of the contact points may overhang the edge of its module pad raising the contact resistance of that connection or the contact point may miss the pad entirely creating an open circuit. Connector-module misalignments have historically been a major source of system failure particularly in the computer industry and these failures routinely occur both before system power up and after same.

Until now, before power up, the principal way to verify that all of the proper electrical contacts between a connector and the pads of a PC module have been made has been to couple the connector and module together and then separate them and check the scratches or "witness marks" made on the module pads by the connector contacts. This verification technique has an inherent disadvantage in that it requires the module to be removed from the connector in order to observe that all of the contact points were aligned with the module pads. Obviously, misalignments may occur if the module is plugged back into the connector improperly. Also, even after the system is powered up, a failure can occur due to misalignment of a connector and its module caused by vibration of the equipment or thermal changes, for example.

There do exist in the art of various instruments for testing electrocontinuity between printed circuit modules and their connectors. See U.S. Pat. No. 3,784,910, for example. However, these tend to be complex and costly pieces of equipment and the testing procedure is quite time-consuming due to the large number of such modules present in a typical computer or electrical system.

U.S. Pat. No. 4,507,697 discloses a device for verifying continuity between a circuit board or card and its connector indirectly by indicating the position of the circuit card with respect to its connector. That particular device is able to detect three positions of the card relative to its connector. In the first or correctly installed position, good safe contacts between the corresponding conductor elements of the connector and card are assured; in the second or intermediate position, the contacts between the corresponding conductor elements of the connector and card are not safe, as when a card is being inserted or removed with respect to its connector, so that the connections cannot be viewed as assured, and in the third position, a card is completely removed from its connector so that no contact is established between the corresponding conductor elements of the connector and the card. By accurately knowing the position of each card, power can be turned on to each card position selectively without shutting the entire system down.

That prior apparatus detects the position of the card by means of a switch actuator that engages a notched edge of the card which functions as a cam surface that defines the three positions of the card relative to the connector. Thus, that arrangement requires a mechanical switch actuator at each card position, which actuators take up needed space. Also, while that apparatus can detect whether or not a card is plugged into its connector, it cannot necessarily verify that a particular card is plugged in completely so that all of the contacts of the connector are disposed opposite the corresponding terminal pads of the card or module.

The above described prior testers and position indicating devices are particulrly disadvantaged in that they do not allow for the monitoring or tracking of small shifts in the position of a card or module that occur after system power up and during normal operation of the system. Accordingly, they cannot be used to detect incipient connector-module misalignments so that prompt corrective action can be taken before a failure actually occurs.

SUMMARY OF THE INVENTION

Accordingly, it is an object of the present invention to provide a system which verifies and monitors automatically the alignment of a printed circuit card or module with respect to the connector to which it is coupled.

Another object of the invention is to provide a system of this type which can be incorporated easily into an otherwise conventional printed circuit module-connector assembly.

A further object of the invention is to provide such a system which permits the verification of connector-module alignment before the overall system is powered up and also while that system is in operation.

Yet another object of the invention is to provide such a system which continuously monitors the relative movement of a printed circuit module and its connector and allows the identification of a potential misalignment problem before that problem actually occurs.

Another object of the invention is to provide a connector alignment verification and monitoring system which increases the overall reliability of computer and electrical systems by checking the initial locations of the contact points of a connector with respect to the corresponding module terminal pads and tracking the relative movement of the connector and module during the day-to-day operation of the system.

Other objects will, in part, be obvious and will, in part, appear hereinafter.

The invention accordingly comprises the features of construction, combination of elements and arrangement of parts which will be exemplified in the following detailed description, and the scope of the invention will be indicated in the claims.

A printed circuit card or module usually has an array of terminal pads. In accordance with this invention, at least one alignment pad is printed on the card or module simultaneously with the terminal pads of that module. Each alignment pad is comparable dimensionally to the terminal pads and is subdivided into a plurality of smaller, electrically isolated conductive islands or features which correspond to different x and y coordinate positions on each terminal pad. In other words, the features subdivide or resolve the terminal pads along and across the plane of the terminal pad array. At least one feature of each alignment pad is located near the middle of that pad, other features are located closer to the boundaries of the pad. A separate printed conductor extends from each feature to an alignment indicating circuit which may be on the module or elsewhere.

The connector to which the card or module is coupled is provided with a contact corresponding to each terminal and alignment pad on the module and at least one wire or conductor in the cable terminated by that connector also leads to the alignment indicating circuit. That circuit, in its simplest form, can be composed of a set of indicating lamps, one set for each alignment pad on the module, with each lamp of a given set being connected between electrical ground and one of the conductive features of the corresponding alignment pad. The connector contact associated with each alignment pad is connected to a voltage source capable of energizing those lamps.

When the printed circuit module is plugged into or otherwise coupled to its connector, if those two components are in proper alignment, a connector contact will engage one or more middle features of the corresponding alignment pad and the lamp(s) associated with that feature(s) will be turned on signalling that fact. On the other hand, if the module and connector are misaligned in the X and/or Y direction, the connector contact will engage another feature of the alignment pad and the lamp associated with that other feature will be illuminated thereby signalling the direction and extend of the misalignment. Thus, by observing the set or sets of indicating lamps, one can verify that the module is in proper alignment with its connector and by monitoring each lamp set oven time, one can spot a module that is shifting relative to its connector and take corrective action before the module becomes so out of alignment as to cause a circuit failure.

BRIEF DESCRIPTION OF THE DRAWING

For a fuller understanding of the nature and objects of the invention, reference should be had to the following detailed description, taken in connection with the accompanying drawing in which.

DESCRIPTION OF THE PREFERRED EMBODIMENT

Figure 1:
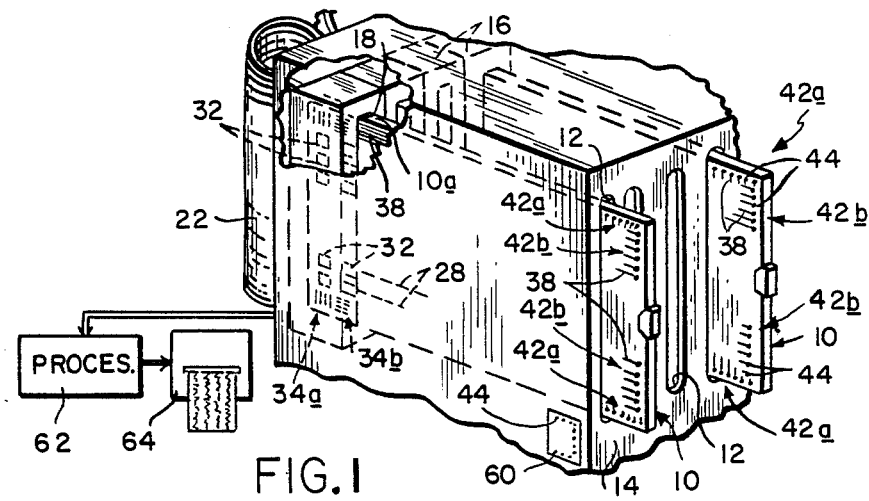
FIG. 1 is a fragment isometric view showing my connector position verification and monitoring system incorporated into a rack of plug-in printed circuit cards or modules.

FIG. 1 shows a plurality of printed circuit cards or modules 10 plugged into the slots 12 of a computer rack panel 14, the panel usually constituting part of a larger computer or electrical system. Mounted to the back of the rack panel opposite each slot 12 is an edge connector 16 having a socket 18 arranged to receive the rear edge margin 10a of a module 10. Connections between the modules 10 and between the modules and other components of the system are established by flexible cables or harnesses 22 extending from the various connectors 16.

Formed on at least one face of each module 10 are the usual conductive paths 28 which interconnect the various electrical components (not shown) mounted to the board. Selected ones of these paths lead to printed terminal pads 32 arranged in parallel rows at the rear edge margin 10a of the module 10. The illustrated module has two rows of pads 32, each pad being a square, about 50 mil on a side. These pad dimensions may, however, vary from module to module and in the drawing they are shown exaggerated in size for ease of illustration.

Also printed on module 10, preferably simultaneously with the terminal pads 32, is at least one pair of conductive alignment pads 34a and 34b. The illustrated module 10 has two pairs of alignment pads located at the corners of module edge margin 10a. The alignment pads 34a are aligned with the outer or endmost row of terminal pads 32 and the alignment pads 34b are aligned with the inner row of terminal pads.

Figure 2:
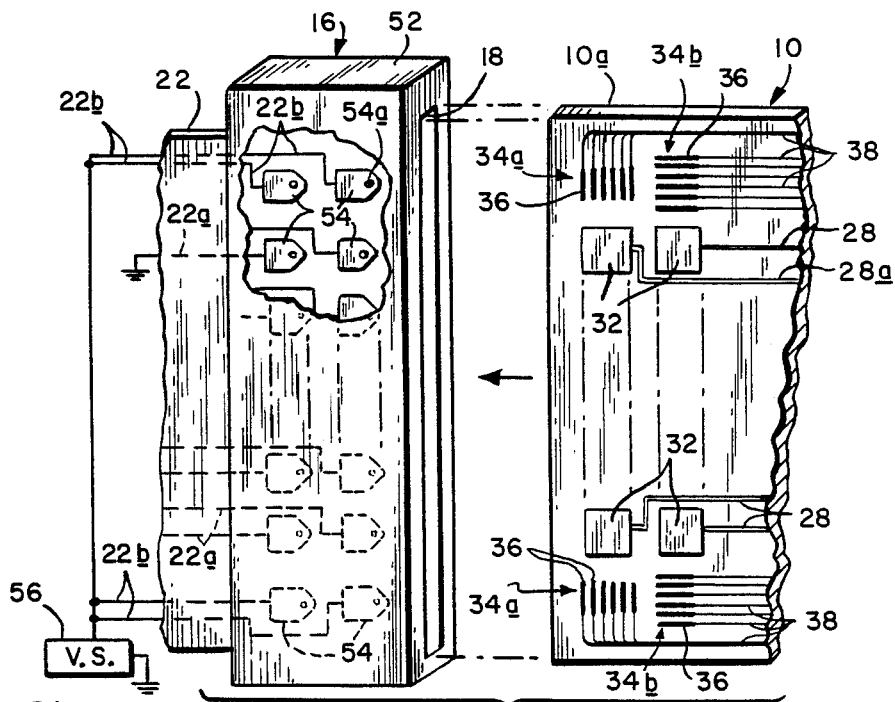
FIG. 2 is an exploded isometric view on a larger scale, with parts broken away, showing the FIG. 1 system in greater detail.
Figure 3:
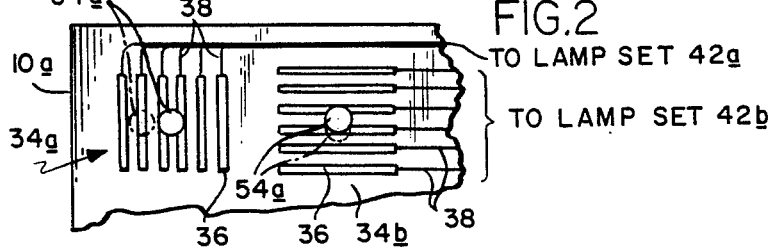
FIG. 3 is a fragmentary plan view on a still larger scale of a card or module of the FIG. 1 system which helps to explain the operation of the FIG. 1 system.

As best seen in FIGS. 2 and 3, each alignment pad 34a consists of a longitudinal array or set of closely-spaced parallel, transversely-extending printed stripes 36. Preferably, the pad 34a stripe array should be longer than the longitudinal dimension of the terminal pads 32. The illustrated pads 34a - have six stripes 36, each one being in the order of 5 mils wide with adjacent strips being about 6 mils apart. Consequently, each pad 34a is somewhat longer than the terminal pads 32 so that the two end most stripes 36 in each pad 34a extend beyond the edges of the terminal pads 32 in the end-most row of such pads on module 10. Actually, in the illustrated module 10, the alignment pads 34a, are in the order of 60 mil on a side so that one stripe 36 overhangs each of the front and rear edges of the pads 32 in the outer row of pads.

Alignment pads 34b consist of substantially identical sets of printed stripes 36. However, those stripes are printed on module 10 in a transversely extending set or array and they extend longitudinally on module 10 at the opposite ends of the inner row of terminal pads 32. Being also 60 mil on a side, the pads 34b are wider by two stripes 36 then pads 32.

Thus, as best seen in FIG. 2, the alignment pads 34a subdivide or resolve the terminal pads 32 in the longitudinal direction, i.e. along module 10. For example, the gap between the two middle stripes 36 in each alignment pad 34a denotes the longitudinal center of pads 32. Likewise, the inner edges of the two outer-most stripes 36 comprising each pad 34a demark the front and rear edges of those pads 32. The other strips 36 of pads 34a correspond to intermediate positions along tabs 32.

In the same manner, the stripes 36 comprising alignment pads 34b subdivide or resolve the terminal pads 32 in the transverse direction, i.e. across the width of module 10. Thus the gap between the two middle stripes 36 of each pad 34b represents the transverse centerline of each tab 32 while the inner edges of the two outer-most stripes comprising each tab 34b demark the side edges of tabs 32, the remaining stripes of those pads 34b denoting intermediate positions across tabs 32.

Referring now to FIGS. 1 and 2, printed conductors 38 extend from the stripes 36 of each alignment pad 34a to a set 42a of indicating lamps 44 which may be, for example, light emitting diodes (LEDs). The lamp set 42a is disposed along the corresponding side edge margin of module 10, there being one lamp for each stripe 36 of the alignment pad 34a. Each conductor 38 is connected to one terminal of the corresponding indicating lamp 44, the other terminal of that lamp being connected to the module's ground conductor shown at 28a in FIG. 2.

In similar fashion, the stripes 36 of each alignment pad 34b are connected by way of printed conductors 38 to a set 42b of indicating lamps 44 located adjacent to the front edge of module 10. Here again, the number of lamps in each lamp set 42b equals the number of stripes 36 in the corresponding alignment pad 34b, with each lamp 44 being connected between the corresponding conductor 38 and the module's ground conductor shown at 28a.

Still referring to FIGS. 1 and 2, connector 16 may be of any conventional construction which establishes electrical contact between the conductors or wires of cable 22 and the terminal pads of module 10 when that module is plugged properly into a slot 12 of rack panel 14. The illustrated connector 16 comprises a housing 52 made of a suitable rugged insulating material. Positioned inside housing 52 are two rows of spring contacts 54, one contact for each pad 32, and one for each pad 34a, 34b on module 10. The positions and spacings of contacts 54 in housing 52 correspond to the positions of the tabs 32, 34a, 34b on module 10 so that when the rear edge margin 10a of module 10 is plugged into housing 52 and the housing and module are in proper alignment, contacts 54 will be disposed opposite to, and resiliently engage, the corresponding tabs 32, 34a, 34b. The various conductors or wires 22a of cable 22 are soldered, wire-wrapped or otherwise connected electrically to contacts 54 in the same manner as any conventional connector-terminated cable.

To increase contact force, each contact 54 is usully provided with a small raised contact feature or bump 54a which is the only part of the contact which actually engages the corresponding module pad. Typically, the bumps are in the order of 8 mils in diameter, although this dimension may vary widely. Thus in the illustrated arrangement having alignment pad stripes 36 spaced 6 mils apart, a contact bump 54a centered on a pad 34a, 34b would bridge the two middle stripes 36 as shown in solid lines in FIG. 3.

Connector 16 differs from other similar connectors only in that a contact 54 is provided for each alignment pad 34a, 34b so that when module 10 is properly coupled to the connector, a contact 54, or more particularly, its bump 54a will be more or less centered on the corresponding alignment pad 34a, 34b. Each of those alignment pad contacts is connected by way of a cable conductor 22b to a d.c. voltage source 56, the other terminal of which is connected to electrical ground.

Referring now to FIG. 3, in accordance with this invention, when the rear edge margin 10a of a module 10 is plugged into its connector 16, if the connector and module are in proper alignment, all of the contact bumps 54a will be positioned more or less in the middles of the corresponding pads of module 10. This means that the contact 54 engaging each alignment pad 34a will be centered on the two middle stripes 36 of that pad as shown in solid lines in FIG. 3. The contacting of those two middle stripes completes circuits between voltage source 56 and the two middle lamps of each lamp set 42a thereby turning on those two lamps. Likewise, the contacts 54 opposite alignment pads 34b will engage the middle stripes of those two pads thereby completing circuits that turn on the two middle lamps 44 of each of the lamp sets 42b. Since the module's alignment and terminal pads are all formed at the same time, their relative positions are fixed. Similarly, the relative positions of the contacts 54 in connector housing 52 are fixed so that they all move together with the housing. Consequently, the illuminations of the middle lamps 46 of lamp sets 42a, 42b immediately apprise the operator that module 10 is in proper transverse and longitudinal alignment with connector 16, i.e. is fully plugged in, so that a contact 54 will be centered on each terminal pad 32 of that module.

If, however, a module 10 where not fully plugged into its connector 16, the contact bumps 54a of the two contacts 54 opposite alignment pads 34a would be shifted to the left relative to the pads 34a and would contact one or two of the stripes 36 to the left of the middle of those pads, e.g. the fifth stripe from the right as shown in phantom in FIG. 3. Resultantly, not the two middle lamps, but rather the fifth lamp 44 from the front of each lamp set 42a will be illuminated thereby signalling the operator that the module is not plugged in completely.

In the same fashion, if the module is misaligned longitudinally in the opposite direction for one reason or another, one or two lamps 44 of each lamp set 42a to the right of the middle two lamps will be illuminated, the particular lamp(s) that is turned on depending upon the extent of the misalignment.

Misalignment of a module 10 in its connector 16 in the transverse direction is immediately signalled by the lamp sets 42b in the same way. For example, if the module 10 illustrated in FIG. 1 is displaced upwards with respect to its connector 16, the contact bump 54a opposite each alignment pad 34b will no longer make contact with the two middle stripes 36, i.e. the third and fourth stripes down in pad 34b. If the vertical misalignment is relatively small, the bump 54a may contact only the lower one of those two stripes, i.e. the fourth stripe down, as shown in phantom in FIG. 3. This results in a circuit being completed with the fourth lamp 44 of the lamp set 42b connected to each alignment pad 34b. A more serious vertical misalignment will result in the illumination of one or two lamps 44 further down in each lamp set 42b.

Thus, by observing the lamp sets 42a and 42b , the operator can tell immediately if a board 10 is misaligned in the longitudinal and/or transverse direction and the degree of such misalignment(s). Furthermore, by monitoring the status of the lamp sets over time and looking for changes in the positions of the illuminated lamps in the various lamp sets, the operator can tell immediately if a misalignment is becoming worse with passage of time. This enables the operator to correct a misalignment by repositioning the offending board 10 in its connector 16 before the misalignment has become so severe as to cause a system failure. This feature should reduce considerably the amount of downtime due to misalignments of the boards 10.

In the illustrated system, a pair of alignment pads 34a 34b are provided at each of the rear corners of board 10. This is to enable the signalling that a particular module 10 is positioned in its connector 16 in a cocked or skewed condition. In other words, a module 10, particularly a relatively wide one, may be inserted into its connector 16 so that the contact bumps 54a adjacent to one end of the connector 16 properly oppose the corresponding alignment pads 34a and 34b of board 10, but the bumps 54a at the opposite end of connector 16 do not. This type of misalignment would manifest itself by the lamp sets 42a, 42b at one side of board 10 showing a more or less normal indication and the lamp sets at the opposite side of the board signalling both a longitudinal and a transverse misalignment such as the ones shown in phantom in FIG. 3.

Of course, if board 10 is quite narrow or if a skewtype misalignment is not likely due to the mechanical constraints of the connector 16, only one set of alignment pads 34a, 34b and a single corresponding pair of lamp sets 42a, 42b would be needed.

While we have shown the alignment pads as being composed of arrays of straight parallel stripes, other alignment pad configurations may be envisioned that will accomplish the results described herein. For example, each pad might consist of concentric rings. Also, the two pads that detect longitudinal and transverse misalignments may be combined into a single pad composed of a rectangular array of dot-like features connected to a corresponding rectangular array of indicating lamps on module 10. Generally, the selection of a particular alignment pad configuration will depend upon the amount of available space on board 10 for the alignment pad or pads and their required electrical connections to the indicating means and on the detection resolution desired. For example, a board 10 with very fine line circuits and many terminal pads 32 may require a verification and monitoring system capable of detecting minute misalignments of the board relative to its connector 16, whereas such close monitoring of a printed circuit board having a few relatively large pads 32 may not be required. Therefore, in the latter case, fewer and/or more widely spaced alignment pad stripes or features 36 may suffice to enable the detection of relatively gross misalignments or movements of board 10.

While we have specifically illustrated a connector alignment verification and monitoring system in which the indicating means, i.e. lamps 44, are provided on the modules 10, it is obvious that the indicators may be located elsewhere, such as on a panel 60 (FIG. 1) mounted to rack 14. In this event, the stripes 36 of the various alignment pads 34a, 34b would be connected to the ground conductor 28a (FIG. 2) of board 10 and the indicating lamps 44 would be connected electrically between voltage source 56 and the various cable conductors 22b leading from contacts 54.

Also, to facilitate the monitoring and detection of changes in the positions of modules 10 with respect to the various connectors 16 over time, particularly if a large number of modules 10 are involved, a microprocessor 62 (FIG. 1) may be programmed to interrogate the alignment pads 34a, 34b of the various boards 10 periodically and control an indicating device 64, such as a strip chart recorder, which can provide the alignment histories of the modules 10. Thus by examining the chart, an operator can immediately verify that the boards are in correct alignment prior to power up and also monitor the alignment conditions of those modules over time while the system is in operation. Thus, if the operator sees that a module 10 is becoming progressively more misaligned, he can take corrective action before there is a failure of that module. Accordingly, the present arrangement not only allows an operator to load the printed circuit modules 10 in rack 14 correctly in a minimum amount of time, it also minimizes downtime of the equipment containing boards 10 due to progressive board misalignments while that equipment is in operation.

It will thus be seen that the objects set forth above among those made apparent from the preceding description are efficiently attained, and, since certain changes may be made in the above construction without departing from the scope of the invention, it is intended that all matter contained in the above description or shown in the accompanying drawing be interpreted as illustrative and not in a limiting sense.

It is also to be understood that the following claims are intended to cover all of the generic and specific features of the invention herein described.

I claim:

1. A connector alignment verification and monitoring system comprising
    a circuit module having a surface lying in a plane defined by a pair of orthogonal axes;
    a plurality of similar terminal pads on said surface, each said pad extending in the directions of said axes;
    a first alignment pad on said module surface, said first alignment pad comprising a set of electrically isolated conductive features which extends in the direction of at least one of said axes for a distance comparable to the extent of a terminal pad in that same direction;
    a corresponding set of electrical conductors on said module surface leading from said features;
    a connector including an array of electrical contacts for contacting said pads; and
    means for coupling the connector and module together so that a said connector contact is disposed opposite, and establishes electrical continuity with, at least one, but less than all of the features of said first alignment pad; and
    indicating means in circuit with said first alignment pad and its said connector contact for indicating which feature or features of that pad has established the electrical continuity between the first alignment pad and its said contact.

2. The system defined in claim 1 wherein said set of features extends in the directions of both of said axes.

3. The system defined in claim 1 wherein said module includes a second alignment pad on said board surface, said second pad being composed of a second set of electrically isolated conductive features, said second set of features extending in the direction of the other of said axes for a distance comparable to the extent of a terminal pad in that same direction, said connector also having a contact disposed opposite said second alignment pad and making contact with at least one, but less than all of the features of said second alignment pad; and
    a second set of electrical conductors on said board surface leading from the features of said second alignment pad, said second set of conductors being connected electrically to said indicating means so that the indicating means also indicate which feature or features of the second alignment pad has established the electrical continuity between the second alignment pad and the contact opposite that pad.

4. The system defined in claim 3 wherein the features comprising the first and second alignment pads include a plurality of closely spaced-apart conductive stripes, the stripes of the second alignment pad extending in the direction of said one of said axes and the stripes of the first alignment pad extending in the direction of said other of said axes.

5. The system defined in claim 4 wherein said terminal pads are arranged in a line near to an edge of said module that extends in the direction of a selected one of said axes and said module includes two pairs of first and second alignment pads spaced apart near to said edge.

6. The system defined in claim 3 wherein said indicating means include a first set of light-emitting means connected between the conductors of said first set of conductors and at least one of said terminal pads and a second set of light-emitting means connected between the conductors of said second set of conductors and said at least one of said terminal pads.

7. The system defined in claim 3 wherein said plurality of terminal pads include a ground pad and said first and second sets of conductors are connected electrically to said ground pad.

8. The system defined in claim 7 wherein said indicating means are connected electrically to the connector contacts opposite said first and second alignment pads.

9. The system defined in claim 1 wherein said indicating means comprise light-emitting means mounted to said module and connected electrically between conductors of said first set of conductors and at least one of said terminal pads.

10. The system defined in claim 1 wherein said first and second sets of conductors are connected electrically to at least one of said terminal pads and said indicating means are connected electrically to the connector contact opposite said first alignment pad.

11. The system defined in claim 10 wherein said indicating means include processing means for interrogating said first alignment pad periodically to monitor which feature or features of said first pad has electrical continuity with the contact opposite that pad, and
means for displaying the electrical continuity data developed by the processing means over time.

12. A connector alignment verification and monitoring system comprising
a circuit module having a surface with a generally straight edge;
a plurality of spaced-apart, geometrically similar conductive terminal pads on said surface adjacent to said edge, each of said terminal pads having selected dimensions parallel to and perpendicular to said edge;
alignment sensing means on said module surface near said edge, said alignment sensing means including a first series of spaced-apart electrically isolated conductive features extending along the module surface generally in the direction of said edge;
a connector and means for coupling the connector to said module, said connector including a plurality of contacts which are disposed opposite, and establish electrical continuity with, said terminal pads on said module when the connector and module are in proper alignment, said connector also including an alignment contact which only contacts a selected one or more of the features of said first series of features; and
indicating means in circuit with said alignment sensing means for indicating which feature or features of said first series of features is contacted by said alignment contact.

13. The system defined in claim 12
wherein the indicating means include processing means for interrogating said alignment sensing means to monitor which feature or features of said first series of features is contacted by said alignment contact and producing corresponding alignment data from said interrogations, and
means for displaying the alignment data produced by said processing means over time.

14. The system defined in claim 12 wherein
said alignment sensing means also include a second series of spaced-apart electrically isolated conductive features extending along said surface generally perpendicular to said first series of features;
said connector also includes a second alignment contact which only contacts a selected one or more of said second series of features; and
said indicting means also indicate which feature or features of the second series of features is contacted by said second alignment contact.

15. The system defined in claim 14 wherein said features comprise conductive stripes with the stripes in the first and second series being perpendicular to one another.

16. The system defined in claim 14 wherein said first and second series of features are positioned at or near one end of said edge.

17. The system defined in claim 16 and further including
third and fourth series of features similar to said first and second series of features, respectively, positioned at or near the other end of said edge; third and fourth alignment contacts which only contact a selected one or more of the features of said third and fourth series of features, respectively, said indicating means also indicating which feature or features of each of said third and fourth series of features is contacted by said third and fourth alignment contacts, respectively.

18. The system defined in claim 14 wherein at least one of the terminal pads of said module is a grounding terminal and means on said module for connecting each of said features to said grounding terminal.

19. The system defined in claim 14 wherein at least one of said terminal pads on said module constitutes a grounding terminal and further including separate light emitting means mounted to said module and connected electrically between said grounding terminal and each of said features for signalling which feature or features of said first series of features is contacted by said first alignment contact and which feature or features of said second series of features is contacted by said second alignment contact.

20. The system defined in claim 19 wherein each of said light emitting means comprises a light emitting diode connected electrically between said grounding terminal and a

* * * * *